(12) United States Patent
Zhang et al.

(10) Patent No.: US 7,391,210 B2
(45) Date of Patent: Jun. 24, 2008

(54) INTEGRATED FLUXGATE-INDUCTION SENSOR

(75) Inventors: Yongming Zhang, San Diego, CA (US); Andrew D. Hibbs, La Jolla, CA (US); Robert Earl Grimm, Golden, CO (US)

(73) Assignee: QUASAR Federal Systems, Inc., San Diego, CA (US)

( * ) Notice: Subject to any disclaimer, the term of this patent is extended or adjusted under 35 U.S.C. 154(b) by 16 days.

(21) Appl. No.: 11/219,664

(22) Filed: Sep. 7, 2005

(65) Prior Publication Data

US 2006/0181272 A1   Aug. 17, 2006

Related U.S. Application Data

(60) Provisional application No. 60/607,301, filed on Sep. 7, 2004.

(51) Int. Cl.
G01R 33/02 (2006.01)
G01R 33/04 (2006.01)

(52) U.S. Cl. .......................... 324/253; 324/244

(58) Field of Classification Search ......... 324/253–255, 324/225, 233, 202, 244, 247, 258, 260; 330/84, 330/107, 110
See application file for complete search history.

(56) References Cited

U.S. PATENT DOCUMENTS

| | | | |
|---|---|---|---|
| 2,281,960 A | 5/1942 | Vacquier | |
| 2,406,870 A | 9/1946 | Vacquier | |
| 2,407,202 A | 9/1946 | Vacquier | |
| 4,463,314 A | 7/1984 | Wilson | |
| 5,287,057 A | 2/1994 | Gotoh | |
| 5,557,199 A | 9/1996 | Bowman et al. | |
| 5,831,431 A | 11/1998 | Gottfried-Gottfried et al. | |
| 5,939,881 A | 8/1999 | Slater et al. | |
| 6,456,069 B1 | 9/2002 | Scarzello et al. | |
| 6,597,178 B1 | 7/2003 | Nichols et al. | |
| 6,873,265 B2 | 3/2005 | Bleier | |
| 7,123,005 B2 * | 10/2006 | Leger et al. | 324/253 |
| 2004/0108854 A1 | 6/2004 | Nichols | |
| 2005/0134278 A1 | 6/2005 | Nichols | |

OTHER PUBLICATIONS

Bartington Instruments, Ltd., "Operation Manual for *Mag*-01 and *Mag*-01H Single Axis Fluxgate Magnetometers With Mag Probes B-G", OM0382 Issue 6 pp. 1-18.

(Continued)

*Primary Examiner*—Reena Aurora
(74) *Attorney, Agent, or Firm*—Diederiks & Whitelaw, PLC

(57) ABSTRACT

An integrated fluxgate-induction sensor is formed of a combined fluxgate sensor and induction sensor using a common core. The sensor may be in serial operation where it switches between a fluxgate mode for measuring static magnetic fields and an induction mode for measuring alternating magnetic fields. Additionally, the sensor may be used in an interleaved operation where the sensor operates from the fluxgate mode during the transition period where its core is changing from a high permeability state to a low permeability state or vice versa, while the sensor operates in the induction mode when the core is in its high permeability state. The resulting sensor provides for a compact magnetic sensor system capable of sensing magnetic fields which oscillate from zero frequency to 10 kHz and higher.

17 Claims, 2 Drawing Sheets

OTHER PUBLICATIONS http://www.geonics.com/em61.html, "Metal Detection", Aug. 24, 2005.

Grimm, "Triaxial Modeling and Target Classification of Multichannel, Multicomponent EM Data for UXO Discrimination", Journal of Environmental and Engineering Geophysics, vol. 8, Issue 4, pp. 239-250, Dec. 2003.

Ripka, "Review of Fluxgate Sensors", Sensors and Actuators A, vol. 33, pp. 129-141, 1992.

Wold et al., "Detection and Classification of UXO Using Multidimensional EM Sensors", Category: Session 35, Detection, Including Discrimination.

http://meda.com/acsensor.htm, "AC Sensor", Oct. 28, 2003.

\* cited by examiner

INTEGRATED FLUXGATE-INDUCTION SENSOR

CROSS-REFERENCE TO RELATED APPLICATIONS

The present invention claims the benefit of U.S. provisional application No. 60/607,301 entitled "Integrated fluxgate-induction sensor" filed Sep. 7, 2004.

BACKGROUND OF THE INVENTION

1. Field of the Invention

The present invention generally pertains to the art of sensors for measuring magnetic fields. More particularly, this invention relates to a sensor for measuring both static and oscillating magnetic fields.

2. Discussion of the Prior Art

Typically, magnetic sensors are divided into two categories. The first category includes those sensors that are designed to measure static magnetic fields. The second category includes those sensors designed to measure oscillating magnetic fields. For example, the Earth's main magnetic field is quasi-static, while those magnetic fields produced by alternating current electricity are oscillating fields. Sensors designed to measure static or low frequency fields have an upper frequency response generally around a few thousand hertz. For example, fluxgate and optically pumped magnetometers fall into this category. The oscillating magnetic field sensor category is dominated by magnetic induction sensors, which typically operate from 10 Hz to 100 kHz or higher. The exceptions to this rule include the superconducting quantum interface devices (SQUID). SQUID sensors can measure from a static field to a field oscillating at approximately 1 MHz. Magnetoresistive sensors can also measure static and oscillating magnetic fields. However, SQUIDS are difficult to use in practical applications and magnetoresistive sensors lack sensitivity adequate for many applications.

There are a number of emerging applications that require magnetic measurements from a static field to one oscillating in the order of 20 kHz, for which the overall system size and weight are important criteria. For these systems, using separate static and oscillating magnetic sensors is unfavorable. For example, future advanced detection systems for unexploded ordnance will require a combination of static and oscillating magnetic measurements, preferably three-axis vector signals, to provide characterization of target shape and reduce false alarm rate. Present oscillating magnetic field sensors used for unexploded ordnance detection are predominately based on using induction coils. To measure the static magnetic field, a second sensor, usually an optically pumped magnetometer or a fluxgate magnetometer, is required. The need for independent alternating static and magnetic sensors increases system size, weight, and cost, while preventing a rigorously co-located measurement of the target response. Another example of sensors which need a wide frequency response range is sensors used for atmospheric and planetary magnetic fields. The overall size and weight of such sensors are critical factors. In these fields, the largest possible upper operating frequency is typically desired. A further example is sensors used as part of electromagnetic surveillance systems.

In all of these examples, measurements of multiple components of the magnetic field are generally desired. Further, there is a concern that when separate sensors are used, i.e., one sensor for static fields and another sensor for oscillating magnetic fields, the metallic or magnetically permeable components of one magnetic sensor will disturb the field measured by the other sensor. In particular, a static magnetometer, such as a fluxgate magnetometer, cannot generally be put in close proximity to an induction sensor that uses a high permeability core because the signal detected by the fluxgate magnetometer will be affected by the distortion of the magnetic field caused by the induction sensor core.

Accordingly, there exists a need in the art for a compact magnetic sensor system capable of sensing magnetic fields that oscillate from a frequency of zero to 100 kHz and higher. Further, since using separate static and oscillating magnetic sensors is not favorable, a single compact sensor with a capability to operate in the entire frequency range is desired.

SUMMARY OF THE INVENTION

The present invention combines a fluxgate sensor with an induction sensor using the same high-permeability material for both operational modes. The magnetic field sensor constitutes a low-noise sensor and is able to operate in both a fluxgate mode to measure a static magnetic field and an induction mode to measure an oscillating magnetic field. With this structure, potential crosstalk problems with the core are removed verses employing two separate sensors wherein one sensor would affect the response of the other. The present sensor evinces an advantageous combination of bandwidth sensitivity, size, and cost. Further, the present invention makes formation of a multi-axis system easier by minimizing the size of each combination static and oscillating sensor channel.

The sensor may be controlled to perform in either a serial operation or an interleaved operation. In serial operation, a fluxgate mode is operated in durations in the order of one tenth of a second, with alternating induction modes. In the interleaved operation, the sensor is operating in a fluxgate mode during a transition period when the core is changing from a high permeability state to a low permeability state or changing from a low permeability state to a high permeability state, with the sensor operating in the induction mode when the core is at the high permeability state. In such an arrangement, the same coils are used for both the induction sensor and the fluxgate magnetometer. Additionally, other common parts, like the sensing coil and drive coil, are also shared. A specific coil is used as a drive coil for the fluxgate mode and an anti-pulsing coil for the induction mode. Composite cores made of multiple smaller elements are preferably employed for a high frequency operation and fast impulse response.

Additional objects, features and advantages of the present invention will become more readily apparent from the following detailed description of a preferred embodiment when taken in conjunction with the drawings wherein like reference numerals refer to corresponding parts in the several views.

DETAILED DESCRIPTION OF THE PREFERRED EMBODIMENT

Figure 1:
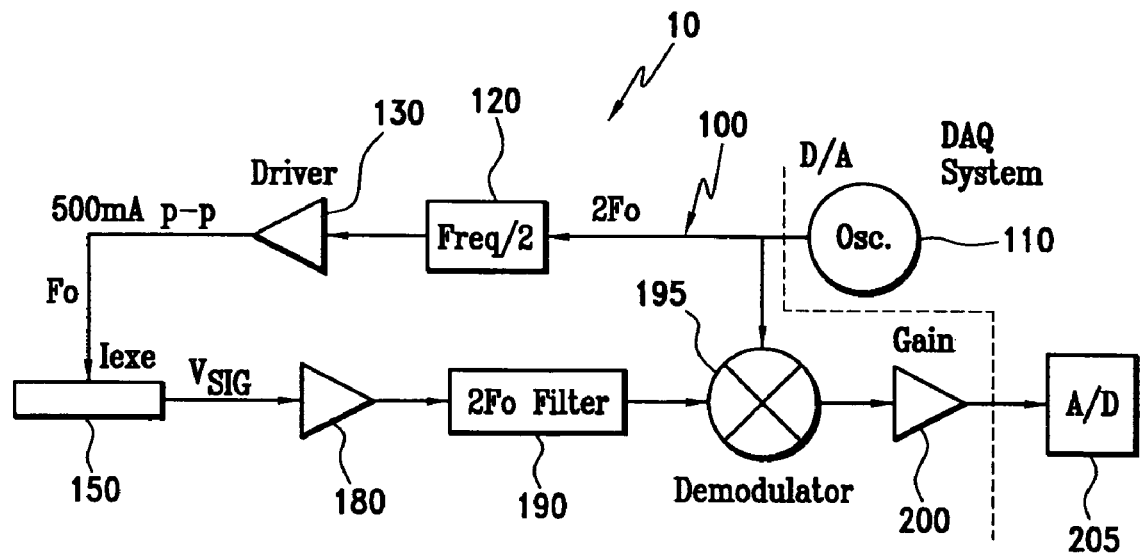
FIG. 1 is a circuit diagram of an integrated fluxgate-induction sensor with an associated probe according to a preferred embodiment of the invention.
Figure 2:
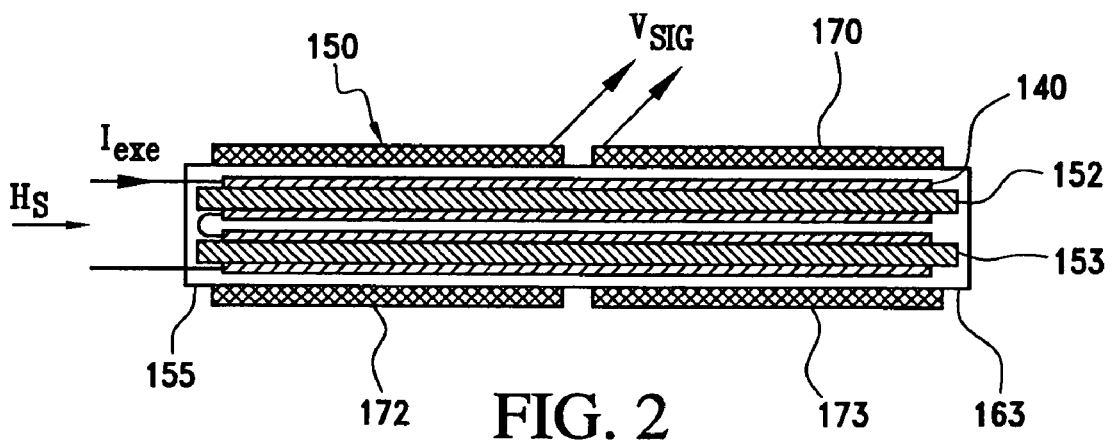
FIG. 2 is a cross-sectional view of the sensor probe shown of FIG. 1.

With initial reference to FIGS. 1 and 2, there is shown a circuit diagram of an integrated fluxgate-induction magnetometer sensor 10 constructed in accordance with the present invention. As illustrated, a drive circuit 100 for sensor 10 includes an oscillator 110 whose signal output is coupled by way of a frequency divider 120 to a driving amplifier 130. The signal is then amplified by driving amplifier 130 and the amplified signal is applied to a drive coil 140 of a probe 150 of sensor 10. As best seen in FIG. 2, drive coil 140 of probe 150 is wrapped around first and second elongated bars 152 and 153, each formed of high magnetic permeable material. Drive coil 140 is wrapped in the reverse direction for both bars 152 and 153. Elongated bars 152 and 153 actually form a core 155 of probe 150. Preferably, the material also has a low energy requirement for saturation. The materials used for elongated bars 152 and 153 could be alloys, such as Hypemik Mumetal and Permalloy, but a nanocrystalline alloy or a ferrite material are preferably employed. As shown, drive coil 140 wraps around both elongated bars 152 and 153 individually. Both elongated bars 152 and 153 are arranged within a support or cover 163. A sensing coil 170, which is wrapped around both elongated bars 152 and 153 of core 155, has split windings 172 and 173 as illustrated in FIG. 2. As referenced in FIG. 1, probe 150 is coupled to a pre-amp 180 and an output of pre-amp 180 is filtered by a filter 190 to produce a filtered signal. The filtered signal is sent to a demodulator 195, which also is controlled by oscillator 110. The output from demodulator 195 is amplified by an amplifier 200 and sent to an analog-to-digital converter 205.

As can be seen from the above description, a fluxgate sensor has been combined with an induction sensor to establish sensor 10, with the same core 155 of high permeability material being employed for both operation modes. The resulting sensor 10 has low noise characteristics and is able to selectively operate both in a fluxgate mode to measure a static magnetic field and in an induction mode to measure an oscillating magnetic field. Sensor 10 is compact in nature and can be produced at a low cost relative to separate fluxgate and induction sensors. Although a double core configuration is shown, a single-core sensor can also be used to form a fluxgate-induction sensor. However, due to the presence of a large unbalanced flux, its performance is not as good as the two-core configuration in detecting the static field.

When operating in a fluxgate mode, oscillator 110 generates an excitation current Iexe having an oscillating voltage signal or waveform with a certain frequency. Preferably, the waveform is an oscillating sawtooth waveform or a conventional sine waveform. The primary frequency of the signal is divided by two in frequency divider 120 and used to drive the material of core 155 of elongated bars 152 and 153 of probe 150 into and out of a magnetically saturated state twice with each two cycles of the waveform. By changing the core permeability, the core field change induces a voltage or output signal in sensing coil 170 proportional to the component of the static magnetic field strength Hs that is parallel to the axis of the drive coil 140. When a magnetic material is saturated, its permeability to further magnetization decreases. The changing core magnetization induces a large voltage in sensing coil 170. Since the two opposing magnetic bars 152 and 153 are placed in the same sensing coil 170, their magnetizations cancel. The only net flux change is that caused by the constant magnetic field Hs and the changing differential permeability. In the preferred embodiment of the invention, drive circuit 100 operates in a second harmonic mode and the driving field in coil 140 is in the order of 1 kHz. The output signal proportional to the magnetic field Hs is filtered by filter 190 and processed by demodulator 195 and amplifier 200 to produce an output signal that represents the magnitude of magnetic field Hs seen by core 155 of magnetic probe 150 due to the magnetic field Hs. Typically, the output signal is then digitized to provide a relatively high resolution digital signal that can be processed by circuitry (not shown) to provide a result displayed to a user or sent to some other processing system.

When sensor 10 operates as an inductive coil, the drive signal applied to drive coil 140 is changed. Rather than providing a drive signal that pushes the high magnetic permeability elongated bars 152 and 153 into and out of saturation, either no signal is provided to core 155 or, alternatively, drive coil 140 is operated as an anti-pulse coil to cancel signals directly coupled into the sensor from a transmitter coil (not shown) in the event that such a transmitter is used to excite magnetic signals in nearby objects. In that case, the magnetic field generated by the anti-pulse current in core 153 needs to be in the same direction as the field generated in core 152. To achieve that, a switch (not shown) is employed to reverse the current direction in one of coils 140 and 170 around cores 152 and 153. In either case, an alternating magnetic field present around core 155 will produce an output signal in sensing coil 170 which is indicative of the change in magnetic field Hs. As is well known, when a circular loop of area encased by a coil is placed in a time changing magnetic field, a voltage signal is induced in the loop that is equal to the negative time rate of change of the magnetic flux passing through the loop. The voltage signal of course can be increased by increasing the number of loops in the sensing coil. Alternatively, a current flows in the coil that is proportional to the magnetic field, and this current can be amplified to produce an output signal.

Figure 3:
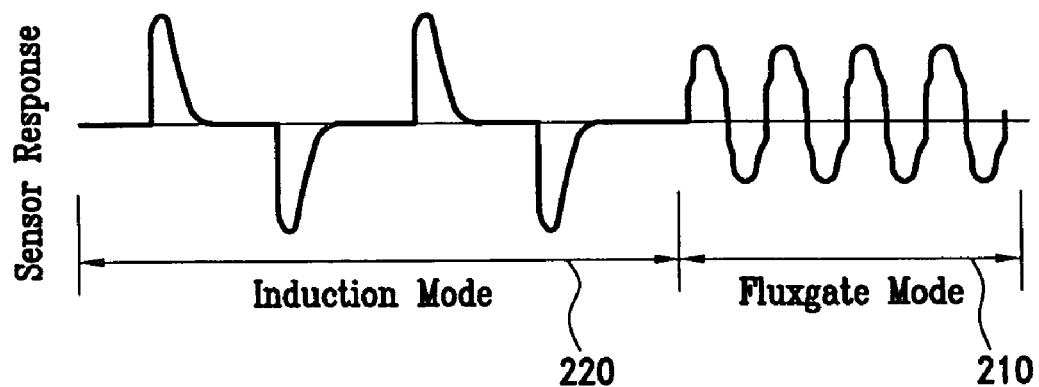
FIG. 3 is a graph showing system response of the integrated fluxgate-induction sensor with induction and fluxgate modes performed in serial operation.
Figure 4:
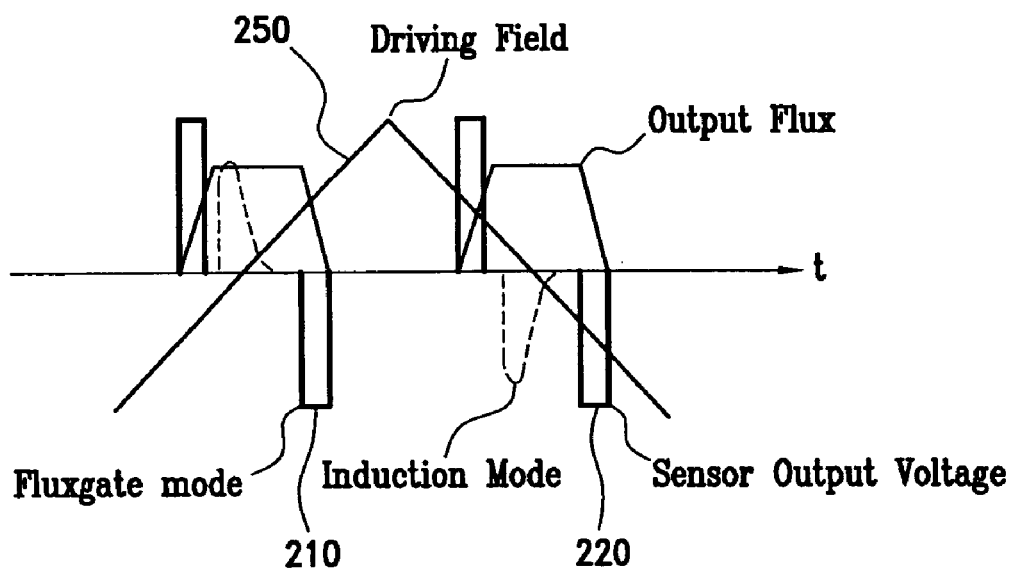
FIG. 4 is a graph showing system response of the integrated fluxgate-induction sensor with induction and fluxgate modes performed in interleaved operation.

Turning now to FIG. 3, there is shown a graph indicating sensor response when sensor 10 is in serial operation. Note that the fluxgate and induction (static and oscillating) sensor modes, 210 and 220 respectively, may be operated independently of one another. Such an operation represents a significant advancement because it provides for more compact sensor geometry. Additionally, sensor 10 may be operated in a time-shared pattern so that, within a suitable period, both sensing modes 210 and 220 make an adequate measurement of both static and oscillating magnetic fields. Depending on the application, the static and oscillating modes 210 and 220 can be operated in serial operation, as shown in FIG. 3, or in interleaved operation, as shown in FIG. 4, with sensor 10 providing an output signal indicative of a magnetic field oscillation in a range of zero (DC) to 10 kHz.

In the serial operation, when fluxgate mode 210 is driven at about 1 kHz, the stable response of sensor 10 can be obtained in the order of 10-100 cycles. Therefore, measurement durations in the order of 0.1 seconds are obtained. Even if an idle period of a few milliseconds is produced to allow core 155 to recover to the high-permeability state after periodic driving field 250 is turned off, the 0.1-second measurement duration still occurs. The repetition of induction mode 220 is preferably a harmonic of 60 Hz to reduce power line interference. For example, if 30 Hz is selected as a repetition rate, there are a total of 33 microseconds for each measurement. Considering fifteen averages, the operating time for induction sensor 10 is in the order of half of a second.

In the interleaved operation, sensor 10 operates in fluxgate mode 210 during the transition period when core 155 is changing from the high-permeability state to the low-permeability state or changing from the low-permeability state to the high-permeability state. Sensor 10 operates in induction mode 220 when core 155 is in the high permeability state.

Although described with reference to a preferred embodiment of the invention, it should be readily understood that various changes and/or modifications can be made to the invention without departing from the spirit thereof. For instance, the shape and overall sensor configuration could be changed. As an example, three magnetic sensors could be set orthogonally to one another and used in a group to obtain multi-axis measurements of the magnetic field under consideration, such as the three-axis vector required to detect unexploded ordinance. In general, the invention is only intended to be limited by the scope of the following claims.

We claim:

1. An integrated fluxgate-induction sensor for measuring magnetic fields comprising:
    a fluxgate sensor including a core;
    an induction sensor including the core of the fluxgate sensor, wherein the integrated fluxgate-induction sensor is adapted to act as a fluxgate sensor in a first mode and an induction sensor in a second mode; and
    means for operating the integrated fluxgate-induction sensor in an interleaved pattern wherein the integrated fluxgate-induction sensor operates in the first mode during a transition period when the core is changing from a high permeability state to a low permeability state or changing from a low permeability state to a high permeability state and operates in the second mode when the core is in a high permeability state.

2. The integrated fluxgate-induction sensor as recited in claim 1, wherein the core is made of two elongated bars formed from a material with high magnetic permeability.

3. The integrated fluxgate-induction sensor as recited in claim 2, further comprising:
    a drive coil wrapped around each of the two elongated bars; and
    a sensing coil wrapped around the core.

4. The integrated fluxgate-induction sensor as recited in claim 3, wherein the sensing coil constitutes a split winding.

5. The integrated fluxgate-induction sensor as recited in claim 3, further comprising:
    a driving circuit attached to the drive coil for providing an excitation current; and
    a sensing circuit attached to the sensor coil and providing an output signal.

6. The integrated fluxgate-induction sensor as recited in claim 5, wherein the driving circuit includes an oscillator for providing a sine or sawtooth-type oscillating voltage signal, a frequency divider attached downstream of the oscillator for dividing the frequency in half, and an amplifier.

7. The integrated fluxgate-induction sensor according to claim 6, wherein said sensing circuit includes a pre-amplifier connected to the sensing coil, a filter connected to the pre-amplifier, and a demodulator connected to both the filter and the oscillator, with the demodulator sending the output signal to an analog-to-digital converter.

8. The integrated fluxgate-induction sensor according to claim 5, wherein the output signal indicates a magnetic field oscillation in a range of zero to 10 kHz.

9. An integrated fluxgate-induction sensor for measuring magnetic fields comprising:
    a core made of two elongated bars;
    a drive coil wrapped around each of the two elongated bars;
    a sensing coil wrapped around the core;
    a driving circuit attached to the drive coil for providing an excitation current in a first fluxgate mode and no excitation current in a second induction mode; and
    a sensing circuit attached to the sensor coil and providing an output signal.

10. The integrated fluxgate-induction sensor as recited in claim 9, wherein each of the two elongated bars is formed of a material with high magnetic permeability.

11. The integrated fluxgate-induction sensor as recited in claim 9, wherein the sensing coil constitutes a split winding.

12. The integrated fluxgate-induction sensor according to claim 9, wherein the driving circuit includes an oscillator for providing a sine or sawtooth-type oscillating voltage signal, a frequency divider attached downstream of the oscillator for dividing the frequency in half, and an amplifier.

13. The integrated fluxgate-induction sensor according to claim 12, wherein said sensing circuit includes a pre-amplifier connected to the sensing coil, a filter connected to the pre-amplifier, and a demodulator connected to both the filter and the oscillator, with the demodulator sending the output signal to an analog-to-digital converter.

14. The integrated fluxgate-induction sensor according to claim 9, wherein the output signal indicates a magnetic field oscillation in a range of zero to 10 kHz.

15. A method of operating an integrated fluxgate-induction sensor having a core including two elongated bars, a drive coil wrapped around each of the two elongated bars, a sensing coil wrapped around the core, a driving circuit and a sensing circuit, the method comprising:
    operating the sensor in a first mode, wherein the sensor acts as a fluxgate sensor changing the permeability of the core to induce a voltage in the sensing coil proportional to a DC magnetic field; and
    operating the sensor in a second mode wherein the sensor acts as an induction coil-type sensor by providing no excitation current so that the core permeability is substantially constant.

16. The method of claim 15, wherein the first and second modes are operated in serial.

17. The method of claim 15, wherein the first and second modes are performed in an interleaved operation.

* * * * *